United States Patent
Thoen et al.

(10) Patent No.: US 6,741,619 B1
(45) Date of Patent: May 25, 2004

(54) SEMICONDUCTOR ELEMENTS FOR STABILIZING LASER OUTPUT

(75) Inventors: Erik R. Thoen, Somerville, MA (US); Elisabeth M. Koontz, Medford, MA (US); Erich P. Ippen, Belmont, MA (US); Leslie A. Kolodziejski, Belmont, MA (US); Franz X. Kaertner, Rhein-Stetten (DE); Hermann A. Haus, Lexington, MA (US); Matthew E. Grein, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/542,061

(22) Filed: Apr. 3, 2000

(51) Int. Cl.[7] .......................... H01S 3/098; H01S 3/10; H01S 3/094; H01S 3/08

(52) U.S. Cl. .......................... 372/18; 372/11; 372/25; 372/75; 372/99

(58) Field of Search .................. 372/11, 18, 25, 372/75, 99

(56) References Cited

U.S. PATENT DOCUMENTS

| | | | |
|---|---|---|---|
| 4,723,248 A | 2/1988 | Harter et al. ................. 372/25 |
| 5,007,059 A | 4/1991 | Keller et al. .................. 372/18 |
| H1177 H * | 4/1993 | Kosah ......................... 372/11 |
| 5,237,577 A | 8/1993 | Keller et al. .................. 372/11 |
| 5,265,107 A | 11/1993 | Delfyett, Jr. ................. 372/11 |
| 5,278,855 A | 1/1994 | Jacobovitz-Veselka et al. ............... 372/44 |
| 5,345,454 A | 9/1994 | Keller ......................... 372/12 |
| 5,627,854 A | 5/1997 | Knox ........................... 372/99 |
| 5,666,373 A | 9/1997 | Sharp et al. .................. 372/18 |
| 5,701,327 A | 12/1997 | Cunningham et al. ........ 327/99 |
| 5,764,679 A * | 6/1998 | Shen et al. .................... 372/69 |
| 5,901,162 A | 5/1999 | Alcock et al. ................. 372/18 |
| 6,078,597 A * | 6/2000 | Feuer ............................. 372/6 |
| 6,252,892 B1 * | 6/2001 | Jiang et al. .................... 372/11 |

OTHER PUBLICATIONS

Spuhler et al., "Passively modelocked diode–pumped erbium–ytterbium glass laser using a semiconductor saturable absorber mirror", Electronics Letters, vol. 35, No. 7, Apr. 1, 1999.*

Brunel et al., "Dynamics of a laser with a reverse saturable absorber," Appl. Phys. B 68, 39–44 (1999).

Doerr et al., "Additive–pulse limiting," Optics Letters, vol. 19, No. 1, pp. 31–33 (Jan. 1, 1994).

Harter et al., "Theory of Mode–Locked Lasers Containing a Reverse Saturable Absorber," IEEE Journal of Quantum Electronics, vol. QE–21, No. 8, pp. 1219–1228 (Aug. 1985).

Haus, "Parameter Ranges for CW Passive Mode Locking," IEEE Journal of Quantum Electronics, vol. QE–12, No. 3, pp. 169–176 (Mar. 1976).

Jiang et al., "Nonlinearly limited saturable–absorber mode locking of an erbium fiber laser," Optics Letters, vol. 24, No. 15, pp. 1074–1076 (Aug. 1, 1999).

(List continued on next page.)

*Primary Examiner*—Paul Ip
*Assistant Examiner*—James Menefee
(74) *Attorney, Agent, or Firm*—Fish & Richardson P.C.

(57) ABSTRACT

Systems and methods for enhancing the stability of a mode-locked laser's output are disclosed. The laser systems include a mode-locking element that mode-locks the laser's output, and a semiconductor element. The semiconductor element produces a loss at the laser's operative wavelength that increases as pulse energy increases, thereby enhancing the stability of the mode-locked output. The semiconductor elements can be used to enhance stability of both passively and actively mode-locked laser systems.

35 Claims, 14 Drawing Sheets

OTHER PUBLICATIONS

Obeidat, "Effects of two-photon absorption in saturable Bragg reflectors used in femtosecond solid state lasers," Optics Express, vol. 1, No. 3, pp. 68–72 (Aug. 4, 1997).

Kartner et al., "Control of solid state laser dynamics by semiconductor devices," Optical Engineering, vol. 34, No. 7, pp. 2024–2036 (Jul. 1995).

Keller, "Semiconductor Nonlinearities for Solid–State Laser Modelocking and Q–Switching," Nonlinear Optics in Semiconductors II, 211–85 (Academic Press, 1999).

Nakazawa et al., "Supermode noise suppression in a harmonically modelocked fibre laser by selfphase modulation and spectral filtering," Electronics Letters, vol. 32, No. 5, pp. 461–463 (Feb. 29, 1996).

* cited by examiner

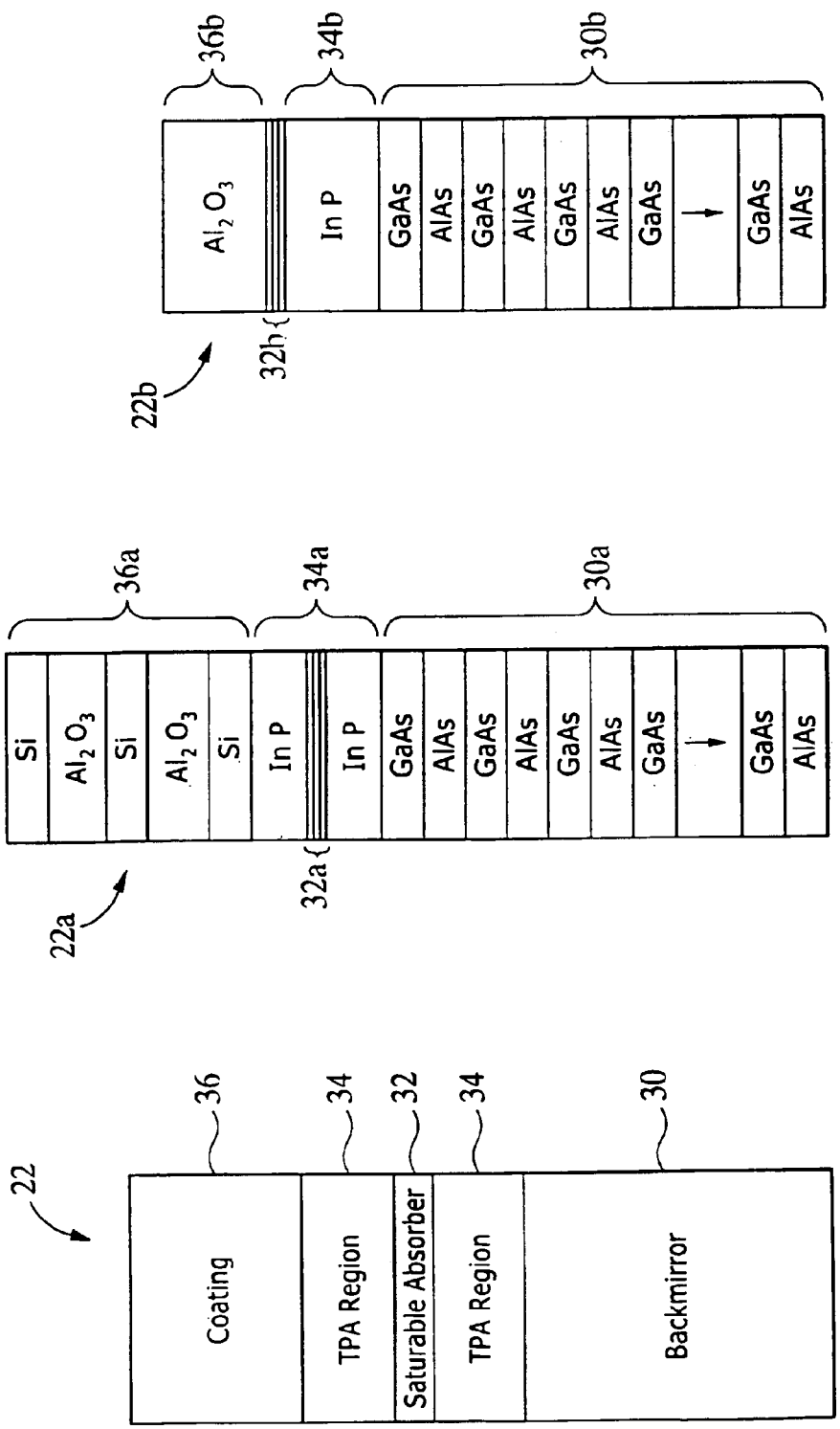

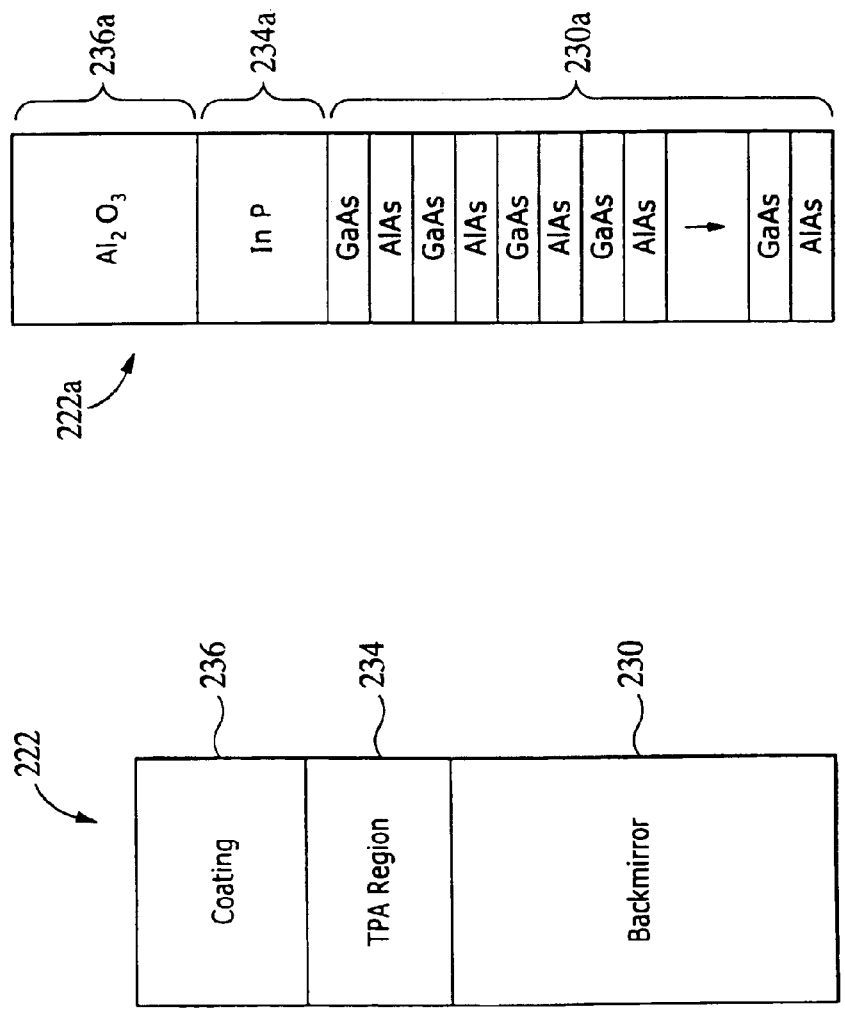

SEMICONDUCTOR ELEMENTS FOR STABILIZING LASER OUTPUT

BACKGROUND

The invention relates to laser systems and laser system components. More particularly, the invention relates to apparatuses and methods for stabilizing a mode-locked laser's output.

Continuous trains of ultra short laser pulses, e.g., picosecond and femtosecond pulses, are useful in wide range of applications, including materials processing and telecommunications. In most laser systems, such trains of ultra short pulses are generated by either "passively" or "actively" mode-locking a laser.

In passive mode-locking, an element in the laser cavity imposes a nonlinear loss on incident radiation, shaping the energy into a train of pulses. In one popular passive mode-locking scheme, semiconductor-based saturable absorber mirrors are incorporated into a laser cavity. These saturable absorber mirrors include semiconductor layers that, for a particular wavelength range, absorb low intensity radiation, but are relatively transparent to high intensity radiation, such as pulses. Therefore, when incident radiation within the wavelength range encounters the saturable absorber mirror, high intensity pulses penetrate the semiconductor absorptive layers and are reflected by a backmirror, while low intensity radiation is partially absorbed. As a result, a laser that includes a saturable absorber mirror favors pulses over low intensity radiation, and therefore produces a repetitive train of generally equal intensity pulses (a "continuous-wave mode-locked" signal), rather than continuous radiation.

In active mode-locking, pulses are generated by imposing a pulse pattern on the laser using an external function generator to drive a modulator. The modulator can be, for example, an electro-optic modulator or an electro-absorption modulator. Typically, the modulation frequency is selected to be a harmonic of the cavity round trip time, in order to maximize the stability of the pulse train.

In both passive and active mode-locking, however, pulse trains can become destabilized by noise or other fluctuations in the laser intensity. In passive mode-locking, perturbations to the system from noise or other sources can cause oscillations in the laser power, or "relaxation oscillations." Unless damped, these relaxation oscillations grow until they transform the continuous-wave mode-locked state into a Q-switched mode-locked state, in which the energy of the pulses varies under a Q-switched envelope. See Kärtner et al., "Control of Solid State Laser Dynamics by Semiconductor Devices," Optical Engineering 34(7): 2024–2036 (1995). In most existing systems, Q-switched mode-locking is avoided only by increasing the power of the laser.

Similarly, in active mode-locking, if all pulse slots generated by the modulator are not fully filled, other harmonics of the cavity round trip time, known as "supermodes," are excited. If supermodes are excited, the stability of the pulse train is reduced, and the laser's usefulness is greatly diminished. To suppress supermodes, various techniques, including additive-pulse limiting and self-phase modulation plus filtering, have been attempted. Both additive-pulse limiting and self-phase modulation plus filtering, however, place constraints on the design of the laser system that are undesirable in many applications.

SUMMARY OF THE INVENTION

In one aspect, the invention features a laser system that produces radiation at an operative wavelength. The system includes a mode-locking element configured to mode-lock the output of the laser system, and a semiconductor element that produces nonlinear increasing loss at the operative wavelength to enhance stability of the mode-locked output.

Embodiments of this aspect of the invention may include one or more of the following features. The semiconductor element includes a semiconductor material that has a band-edge greater than the laser's operative wavelength so that, at the operative wavelength, the material exhibits two-photon absorption, but not one-photon absorption. Alternatively, the semiconductor element can include a semiconductor material that has a conduction band, and the material, when exposed to radiation having the operative wavelength, generates sufficient carriers in the conduction band to initiate sufficient free carrier absorption from the conduction band to produce the nonlinear increasing loss.

The system further includes a reflective structure disposed along an optical path in the cavity, and the semiconductor element includes one or more layers of the material disposed on the reflective structure. Alternatively, the semiconductor element can be included on a transmissive structure in the laser cavity.

The laser system can be tunable to produce radiation over a wavelength range, the wavelength range including the operative wavelength. The mode-locking element can be, e.g., a saturable absorber that passively mode-locks the laser system, or an external function generator that actively mode-locks the laser system.

In another aspect, the invention features a laser system that includes a pump, a gain medium, and a reflector disposed along an optical path in the laser's cavity. The gain medium produces radiation at an operative wavelength when pumped by the pump. The reflector includes one or more layers of a first semiconductor material that acts as a saturable absorber at the operative wavelength to mode-lock the output of the laser, and one or more layers of a second semiconductor material that produces nonlinear increasing loss at the operative wavelength to stabilize the mode-locked output.

Embodiments of this aspect of the invention may include one or more of the following features. The second semiconductor material produces two-photon absorption to achieve the nonlinear increasing loss.

The reflector is configured such that, when light having the operative wavelength is incident upon the reflector, a resulting electric field within the reflector forms a standing wave within the reflector. The standing wave can have a local maximum, e.g., at a location of one or more layers of the first semiconductor material, or at one or more layers of the second semiconductor material.

The second semiconductor material can be, e.g., InP, the first semiconductor material can be, e.g., InGaAs, and the gain medium can be, e.g., an Er/Yb waveguide. The reflector has a dielectric back/mirror and a resonant coating or anti-reflective coating.

In another aspect, the invention features a laser system that includes a pump, a gain medium that produces radiation at an operative wavelength when pumped by the pump, an element that actively mode-locks output of the laser system, and a structure disposed along an optical path in the cavity. The structure includes a semiconductor material that produces nonlinear increasing loss at the operative wavelength to enhance the stability of the mode-locked output.

Embodiments of this aspect of the invention may include one or more of the following features. The material, e.g., InP, produces two-photon absorption to achieve the nonlinear increasing loss. The structure can be, e.g., a reflector that has one or more layers of the material, or a transmissive substrate, such as a waveguide, that includes the material. The gain medium is, e.g., erbium doped fiber.

In another aspect, the invention features a method of enhancing the stability of a continuous wave mode-locked output of a laser that produces radiation at an operative wavelength. The method includes: (a) passively mode-locking the output of the laser to produce a continuous train of pulses; and (b) stabilizing the continuous train of pulses against intensity fluctuations by incorporating into the cavity a semiconductor element that produces a nonlinear increasing loss at the operative wavelength.

Embodiments of this aspect of the invention may include one or more of the following features. The stabilizing step includes stabilizing the continuous train of pulses against Q-switched mode-locking, and the mode-locking step includes mode-locking by incorporating a saturable absorber into the cavity.

In another aspect, the invention features a method of suppressing supermodes in the output of an actively mode-locked laser that produces radiation at an operative wavelength. The method includes: (a) actively mode-locking the laser to produce a continuous train of pulses; and (b) incorporating a semiconductor element into the cavity, the semiconductor element producing a nonlinear increasing loss at the operative wavelength to limit peak intensity of the pulses, and thereby suppress supermodes.

As used herein, the term "nonlinear increasing loss," or "NIL," means a loss that increases as either the peak intensity or pulse energy of the incident radiation increases. An NIL element disposed in a laser cavity, therefore, will produce a loss that increases as the peak intensity or energy of incident pulses increases.

The term "operative wavelength" refers to the wavelength of light produced by a laser system. A laser system that produces light at an operative wavelength can be tunable or non-tunable. If tunable, then the laser system is capable of producing a range of wavelengths that includes the "operative wavelength."

Excited "supermodes" in an actively mode-locked laser are harmonics of the cavity round-trip time at frequencies other than the repetition rate or integer multiples of the repetition rate. In a radio frequency spectrum of an actively mode-locked laser, excited super-modes appear as peaks at frequencies other than the frequency of the external function generator, or integer multiples of that frequency.

Other embodiments and advantages of the invention will be apparent from the following description and from the claims.

BRIEF DESCRIPTION OF THE DRAWINGS

FIG. 4A is a cross-sectional schematic of a mirror having a TPA-based NIL element for use with the laser system of FIG. 3;

FIGS. 4B and 4C are cross-sectional schematics of embodiments of the mirror of FIG. 4A;

FIG. 10A is a cross-sectional schematic of a TPA-based NIL mirror for use with the laser system of FIG. 9;

FIG. 10B is a cross-sectional schematic of an embodiment of the mirror of FIG. 10A;

DESCRIPTION OF THE PREFERRED EMBODIMENTS

Embodiments of the invention include laser systems that incorporate a semiconductor element into the system. The semiconductor element exhibits nonlinear loss at the laser's operative wavelength, where the nonlinear loss increases as the peak intensity or pulse energy increases. These "nonlinear increasing loss" (NIL) elements can be used to stabilize the output of both passively and actively mode-locked lasers.

NIL Elements for Passively Mode-Locked Systems

As discussed above, in a system passively mode-locked by a saturable absorber, relaxation oscillations can transform a continuous wave mode-locked (CWML) state into a Q-switched mode-locked (QSML) state. In a system that includes a saturable absorber but no NIL element, the CWML will be stable against QSML only when:

$$-2E_p \frac{dq_p}{dE_p} \langle \frac{r}{T_L} \tag{1}$$

where $E_p$ is the pulse energy, $q_p$ is the round-trip pulse energy loss of the saturable absorber, r is the number of times above threshold the laser operates, and $T_L$ is the upper-state lifetime of the gain medium divided by the round trip time of the laser. Since the saturable absorber exhibits less loss for higher pulse energies, the derivative of $q_p$ will always be negative. In most existing systems, CWML stability is maintained by pumping further above the threshold (increasing r), which increases the pump power requirements for the laser.

If, however, an NIL element is added, then an additional pulse energy loss is created, and the stability condition becomes:

$$-2E_p \frac{dq_p}{dE_p}(q_p + q_{NIL})\left(\frac{r}{T_L}\right) \qquad (2)$$

where $q_{NIL}$ is the loss due to NIL. Since $q_{NIL}$ increases as pulse energy increases, the derivative of $q_{NIL}$ is always positive.

Figure 1:
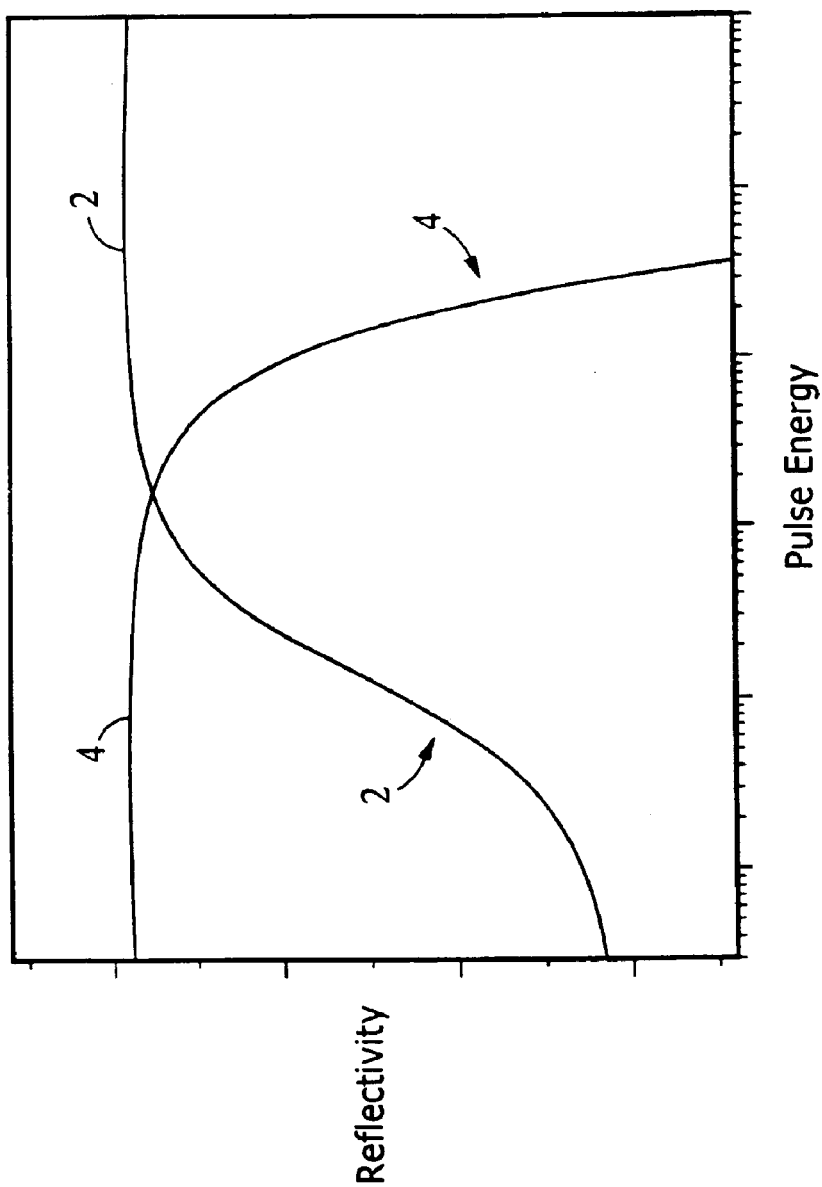
FIG. 1 is a graph illustrating the effect of an NIL element on reflectivity in a laser system.

FIG. 1 graphically illustrates the effect of an NIL element on the loss of a laser system. Referring to FIG. 1, the reflectivity of the saturable absorber is represented by curve 2, while the reflectivity of the NIL element is represented by curve 4. As evident from the figure, the loss caused by the NIL element increases as pulse energy increases, while the loss of the saturable absorber decreases as pulse energy increases. (Reflectivity decreases as loss in the mirror increases.) With the NIL element included in the system, therefore, CWML stability is easier to maintain, and r can be lower.

Figure 2:
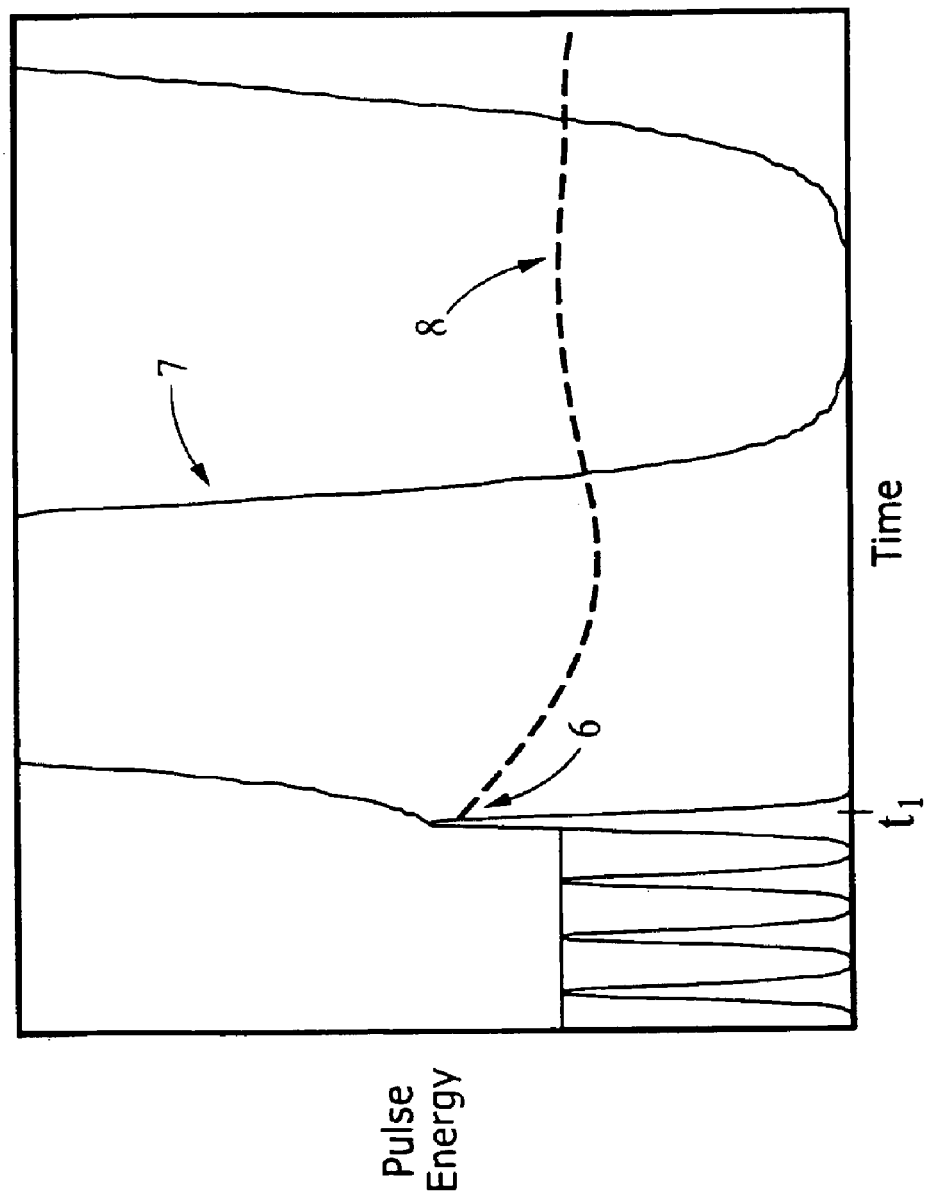
FIG. 2 is a graph illustrating the effect of an NIL element on the stability of a laser pulse train.

FIG. 2 illustrates the theoretical impact of an NIL element on the stability of a mode-locked pulse train. In FIG. 2, a mode-locked pulse train experiences a perturbation 6 at time $t_1$. Without the presence of an NIL element, the laser signal changes to QSML state 7 (a train of pulses of fluctuating energy underneath the Q-switched envelope 7). With an NIL element present, however, the energy of subsequent pulses remains below dotted line 8. Thus, the NIL element acts to enhance the stability of the CWML state.

In embodiments of the invention, the semiconductor NIL elements achieve nonlinear increasing loss by producing one of two processes: two-photon absorption or free carrier absorption. Two-photon absorption (TPA) is defined as excitation of an electron from a ground state to an excited state by two photons. The first photon excites the electron to an intermediate (virtual) state, and the second photon excites the electron to the excited state. TPA occurs in all semiconductors to some extent, but is often the dominant absorption process in undoped semiconductor materials at wavelengths below the band-edge. In other words, TPA dominates at wavelengths for which the band-gap between the ground and excited states is greater than the energy of a single photon. TPA produces nonlinear increasing loss since TPA is more likely to occur with higher peak intensity radiation than lower peak intensity radiation, and since the higher energy levels reachable by two photon excitation are not easily saturated.

In free carrier absorption (FCA), electrons are excited from a first excited state to a second, higher energy state. In a typical FCA process, electrons are first excited from a ground state to the first excited state (sometimes called a "conduction band" in semiconductors). As electrons accumulate in the conduction band, they can be excited from the conduction band to the second, high energy state. FCA will become the dominant absorption process only after sufficient carriers accumulate in the conduction band. Thus, a material that exhibits FCA can generate NIL, since loss due to FCA will increase as more electrons accumulate in the conduction band.

In the sections below, laser systems that employ both TPA-based and FCA-based NIL elements to stabilize a pulse train against QSML are described. The first section describes mirrors that include TPA semiconductor layers to stabilize a laser system against QSML. As discussed below, two of these TPA mirrors were built and tested to determine the effect of the TPA layers on pulse train stability. The second section describes mirrors that exhibit FCA to stabilize against QSML, and the final section describes other possible embodiments of laser systems that use either TPA- or FCA-based NIL elements to stabilize a passively mode-locked laser.

TPA Mirrors for Stabilizing Laser Output

Figure 3:
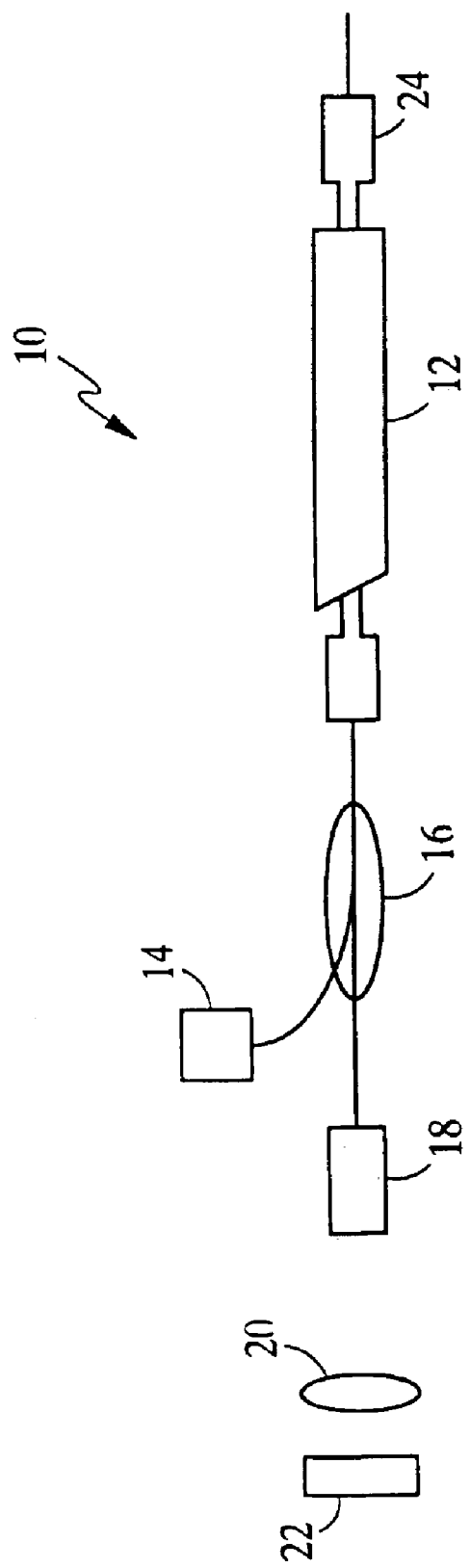
FIG. 3 is a schematic of a laser system that includes a mirror having a semiconductor NIL element.

Referring to FIG. 3, a Er/Yb laser system 10 includes a gain medium 12, a pump 14, a wavelength division multiplexer 16, a collimator 18, a lens 20, a mirror 22, and a 15% output coupler 24. Gain medium 12 is a 5.2 cm Er/Yb waveguide, and pump 14 pumps the waveguide at 980 nm. The wavelength division multiplexer 16 couples pump tight into the cavity. Gain medium 12 produces light centered at about 1540 nm, and collimator 18 directs the light, via lens 20, to mirror 22. Lens 20 acts to control the spot size of the light directed to mirror 22.

Referring to FIG. 4A, mirror 22 includes both a saturable absorber 32 to mode-lock the laser, and TPA-based NIL layers 34 to stabilize the resulting pulse train. Miffor 22 also includes a backmirror 30 and a coating 36, e.g., a resonant or anti-reflective coating. FIGS. 4B and 4C illustrate two possible embodiments of mirror 22, that exhibit different levels of saturable absorption and TPA.

Referring first to FIG. 4B, mirror 22a includes a backmirror 30a, a saturable absorber 32a, a TPA layer 34a, and a resonant coating 36a. Backmirror 30a is a dielectric mirror with twenty-two pairs of alternating GaAs and AlAs layers. Resonant coating 36a is constructed from alternating $Al_2O_3$ and Si layers. TPA layer 34a is a ½λ InP layer, and saturable absorber 32a is four InGaAs quantum wells disposed within the InP layer. Each InGaAs quantum well is about 6–7 nm thick, and the wells are separated by about 7 nm. (For a discussion of InGaAs quantum wells and saturable absorption, see Ursula Keller, "Semiconductor Nonlinearities for Solid-State Laser Modelocking and Q-Switching," in Nonlinear Optics in Semiconductors II, 211–85 (Academic Press, 1999)). Depending on the setting of system 10, saturable absorber 32a produces pulses of approximately 1–9 ps. The semiconductor structures of mirror 22a are deposited using, e.g., gas source molecular beam epitaxy, or other techniques known in the art.

At the operative wavelength of system 10 (about 1540 nm), TPA is the dominant absorption process in indium phosphide. Thus, TPA layer 34a produces nonlinear increasing loss, stabilizing the pulse train against QSML.

Referring to FIG. 4C, mirror 22b is similar to mirror 22a, except that saturable absorber 32b includes only two InGaAs quantum wells, and the quantum wells are located near the edge of InP layer 34b, rather than in the middle of layer 34b. As discussed below with reference to FIGS. 5A–5B. In addition, mirror 22b has an anti-reflective coating 36b, rather than a resonant coating. The anti-reflective coating, can be, e.g., a single ¼λ thick layer of $Al_2O_3$.

Figure 5A:
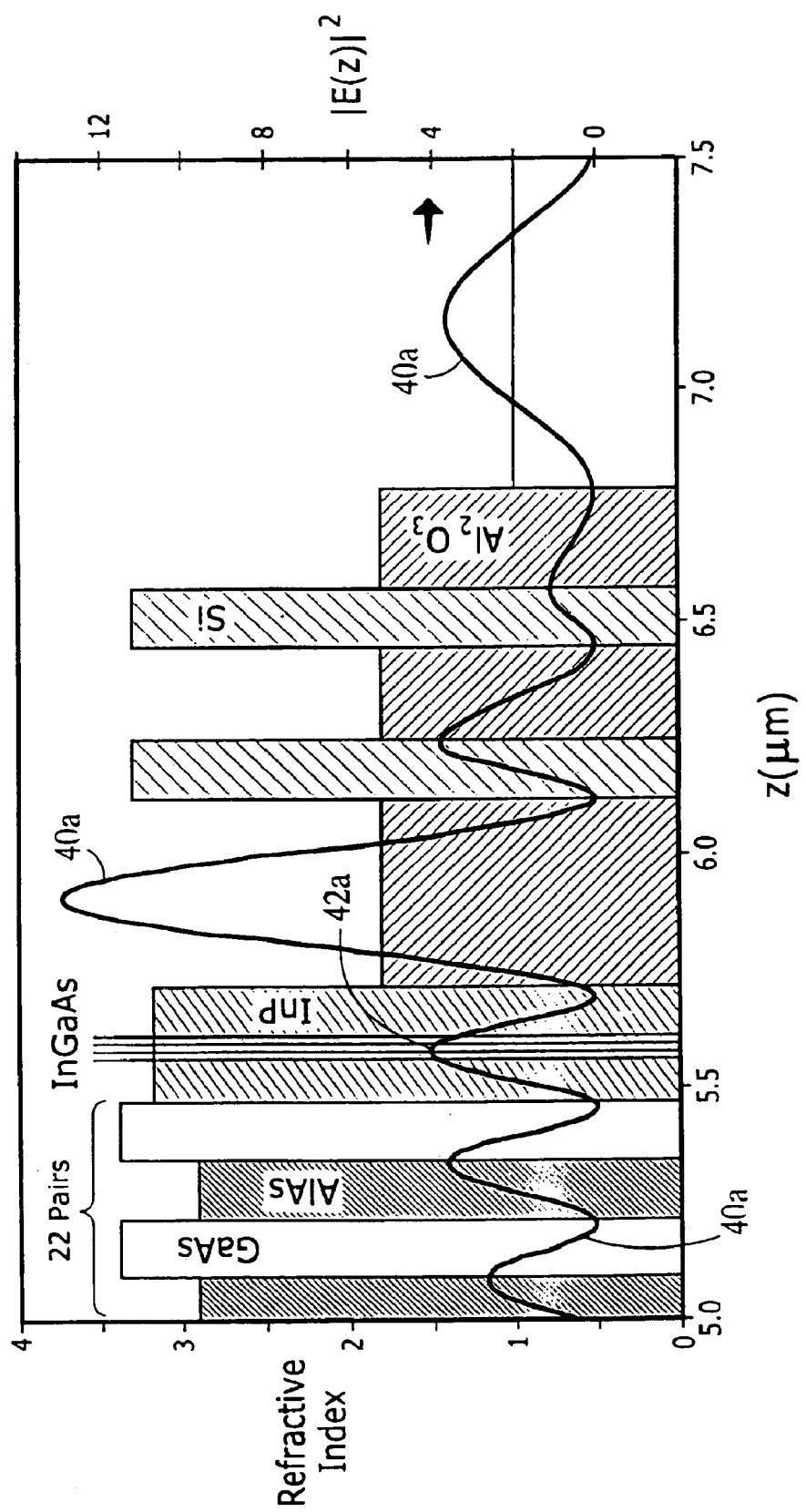
FIGS. 5A and 5B are graphs illustrating variation of the electric field within the mirrors of FIGS. 4A and 4B, respectively.
Figure 5B:
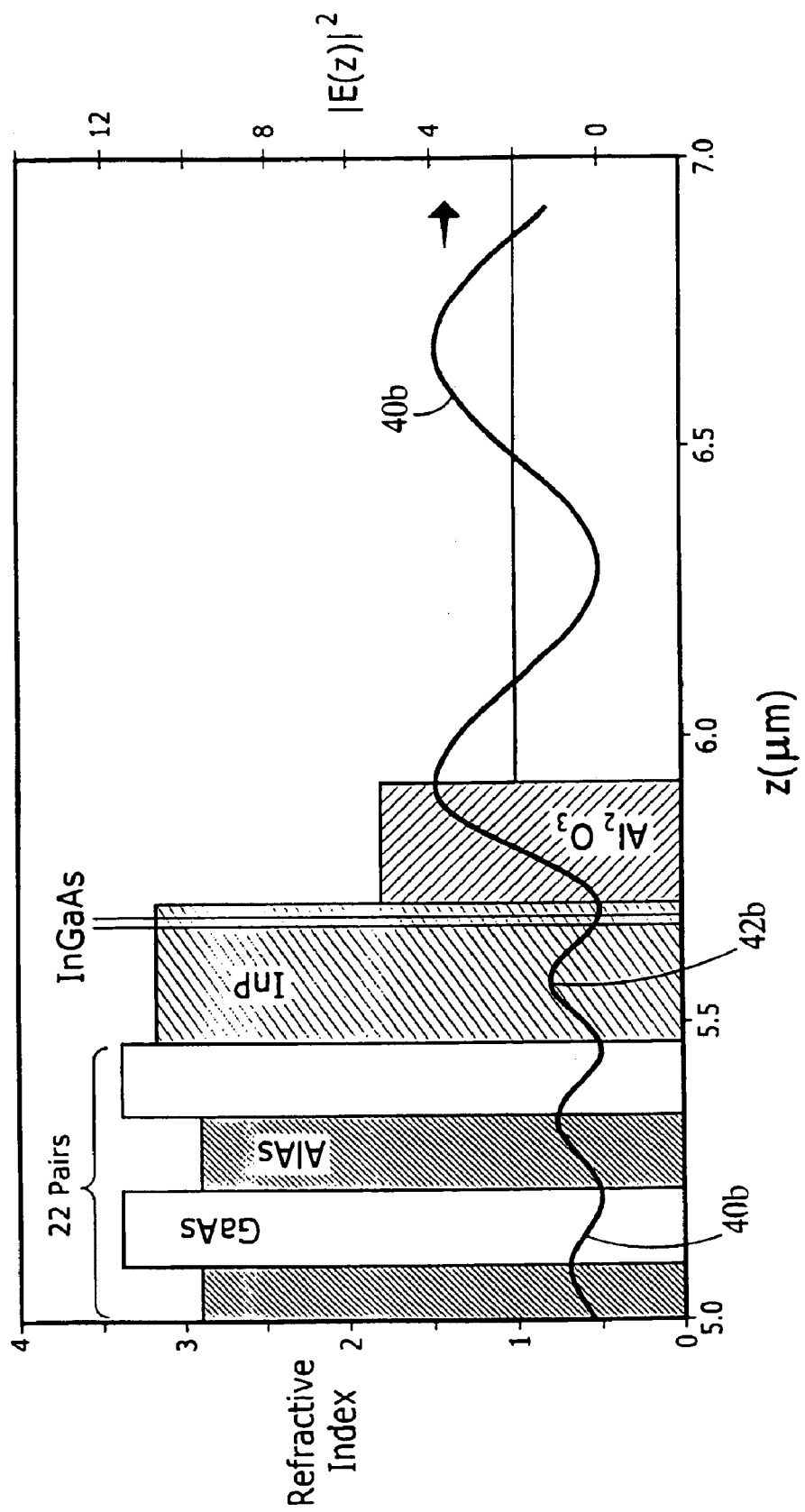

FIGS. 5A and 5B illustrate the effect of varying the location of the quantum wells within the InP layer at the wavelengths produced by system 10. Both FIGS. 5A and 5B are graphs illustrating the intensity of the electric field within mirrors 22a and 22b, respectively, in response to incident light centered at λ=1540 nm. Each graph plots the refractive index (left axis) and the magnitude squared of the electric field (right axis) as a function of distance from the back of the mirror. To obtain the intensity of the electric field at a particular location in the mirror, the magnitude squared of the electric field must be multiplied by the refractive index at that location.

When mirrors 22a and 22b are exposed to incident radiation centered at 1540 nm, standing waves 40a and 40b form in the mirrors. In mirror 22a, standing wave 40a forms a local peak 42a centered over the saturable absorber 32a (FIG. 5A). Thus, in mirror 22a, the impact of the quantum wells of saturable absorber 32a are enhanced, and the modulation depth of saturable absorption is maximized. In contrast, in mirror 22b, standing wave 40b has a local peak 42b within the InP layer 34b, and a local minimum at the quantum wells of absorber 32b (FIG. 5B). Thus, in mirror 22b, the NIL effect of layer 34b is maximized, while the saturable absorption modulation depth is reduced. FIGS. 5A and 5B, therefore, demonstrate that the mirrors can be optimized to enhance either saturable absorption modulation depth, TPA, or a combination of modulation depth and TPA, by manipulating the layers to vary the location of local peaks in the standing wave. Whether modulation depth or TPA should be enhanced depends on the particular application of the laser system.

In both mirrors 22a and 22b, the saturable absorber and the TPA layer are located toward the front of the mirror, since the electric field decays into the mirror due to reflection. If the InP layers 34a, 34b were located further within the mirrors, i.e., within backmirrors 30a, 30b, the NIL produced by the InP layers would be reduced.

Both mirrors 22a and 22b were built and tested to verify the impact of TPA layers 34a, 34b. The data of FIGS. 6A–6B demonstrate that TPA layers 34a, 34b produce NIL, and therefore can enhance the stability of the CWML state against QSML.

Figure 6A:
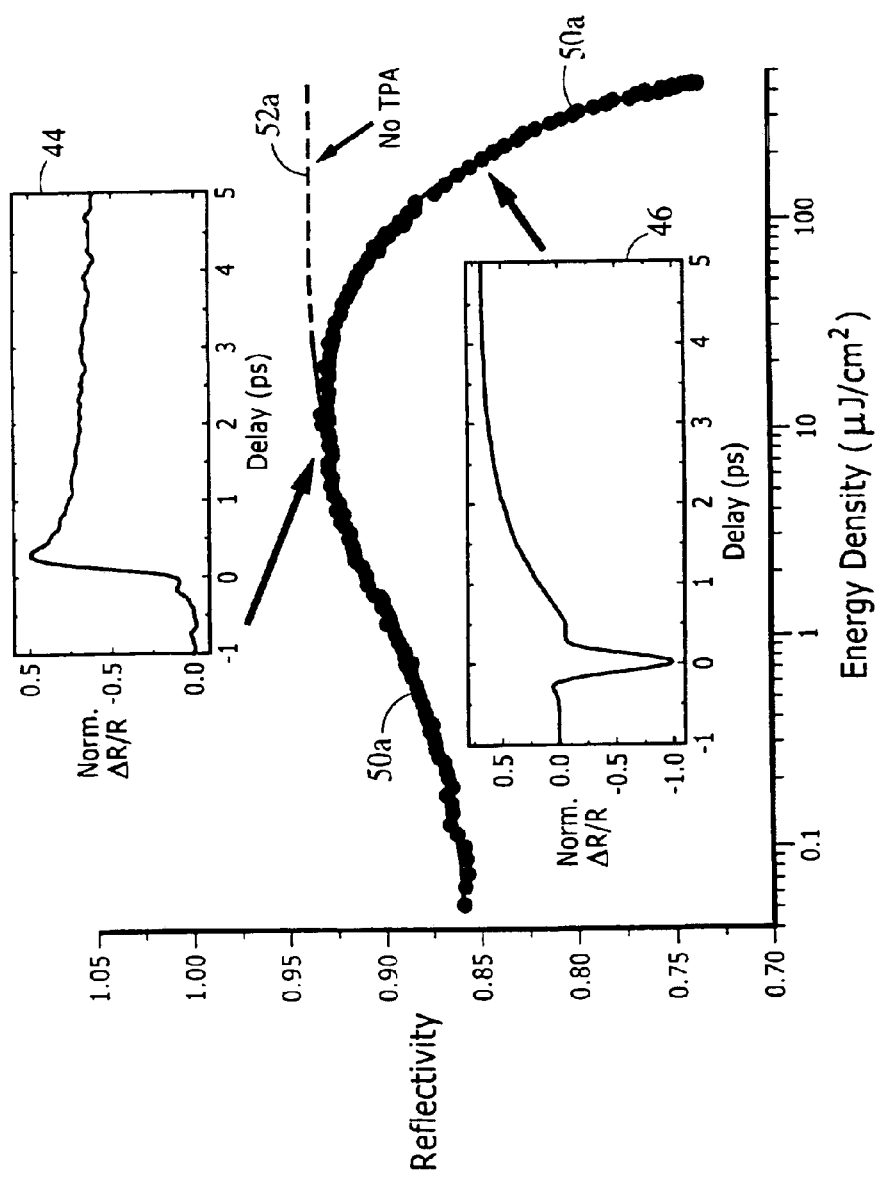
FIGS. 6A and 6B are graphs showing reflectivity data gathered for the mirrors of FIGS. 4A and 4B, respectively.
Figure 6B:
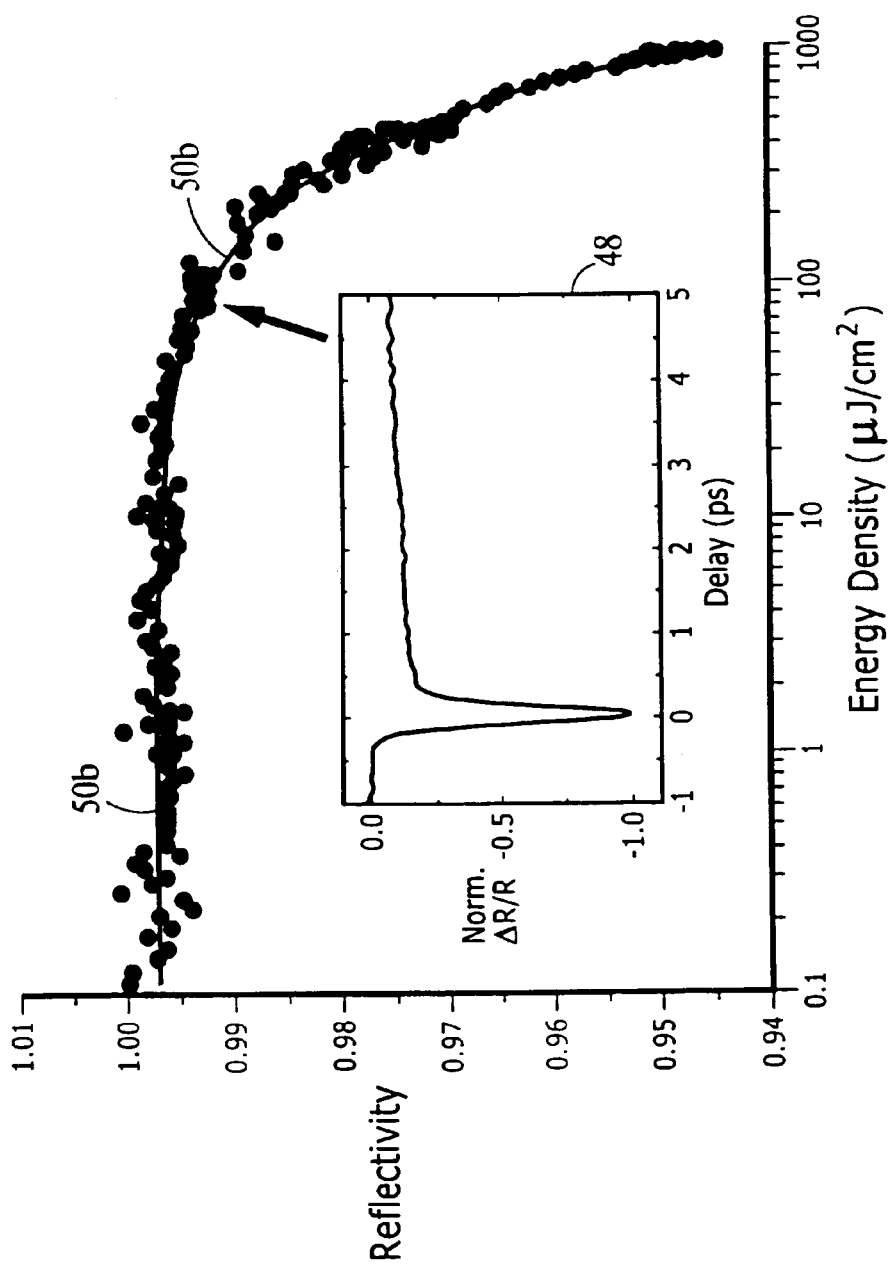

FIGS. 6A and 6B present graphs of the reflectivity of mirrors 22a and 22b as a function of energy density. To generate the data, saturation energy measurements were performed at 1540 nm using 150 fs pulses from a synchronously-pumped optical parametric oscillator with a repetition rate of 82 MHz. The reflectivity was measured over a wide range of incident energy densities with the spot size controlled by lenses of different focal lengths. The spot size was measured via an edge scanning technique at several different distances from the focal lens. In FIG. 6A (mirror 22a), the reflectivity data show a rapid roll-off beginning at about 20 $\mu$J/cm$^2$, due to nonlinear increasing loss caused by TPA.

To verify that the "roll-off" was caused by TPA, pump probe reflectivity measurements were performed at energy densities of about 10 k/cm$^2$ and 200 $\mu$gJ/cm$^2$, using 150 fs pulses at 1.54 $\mu$m from an optical parametric oscillator in a cross-polarized, collinear arrangement. Inset 44 shows the resulting pump probe trace at 10 $\mu$J/cm$^2$, near saturation. At this energy fluence, the trace shows minimal absorption. At 200 $\mu$J/cm$^2$, however, (inset 46), the trace shows absorption from induced TPA at the point where two pulses overlap. Thus, TPA is present in the roll-off region beyond 10 $\mu$J/cm$^2$.

In FIG. 6B, roll-off begins at about 150 $\mu$J/cm$^2$. Inset 48 of FIG. 6B shows the pump probe trace at 80 $\mu$J/cm$^2$, and demonstrates the presence of TPA in the roll-off region. Since the electric field is near null at the InGaAs quantum wells (see FIG. 5B and the accompanying discussion, supra), saturable absorption in FIG. 6B is negligible, and mode-locking would not occur at this wavelength.

For comparison with the data of FIGS. 6A and 6B, the following function for instantaneous reflectivity was calculated:

$$R(t) = 1 - \left( \frac{q_o}{\left(1 + \frac{I(t)}{I_A}\right)} + A\beta I(t) + L_{ns} \right) = 1 - q(t) \quad (3)$$

where R(t) is the instantaneous reflectivity, t is a time on the scale of the pulse width, $q_0$ is the saturable loss, I(t) is the instantaneous pulse intensity, $I_A$ is the saturation intensity of the absorber, A is a structural factor accounting for the absorber thickness and the field distribution determined by both the dielectric coating and the DBR, $\beta$ is the TPA coefficient, and $L_{ns}$ is the nonsaturable loss, all of which define the total saturable absorption, q(t). Equation (3) is based on the fast absorber model of saturable absorption, but adds a loss term for TPA. In equation (3), the first loss term ($q_0/(1+I(t)/I_A)$) is the fast absorber model for saturable absorption, the second loss term (A$\beta$I(t)) is the loss due to TPA, and the third loss term ($L_{ns}$) is the non-saturable loss.

Regressions based on equation (3) are shown in FIGS. 6A and 6B as solid black lines 50a and 50b, respectively. As is clear from the figures, the calculated functions match the data well. In FIG. 6A, the dashed line 52a represents the calculated curve if TPA were not present (i.e., if the second loss term in equation (3) were absent).

Figure 7:
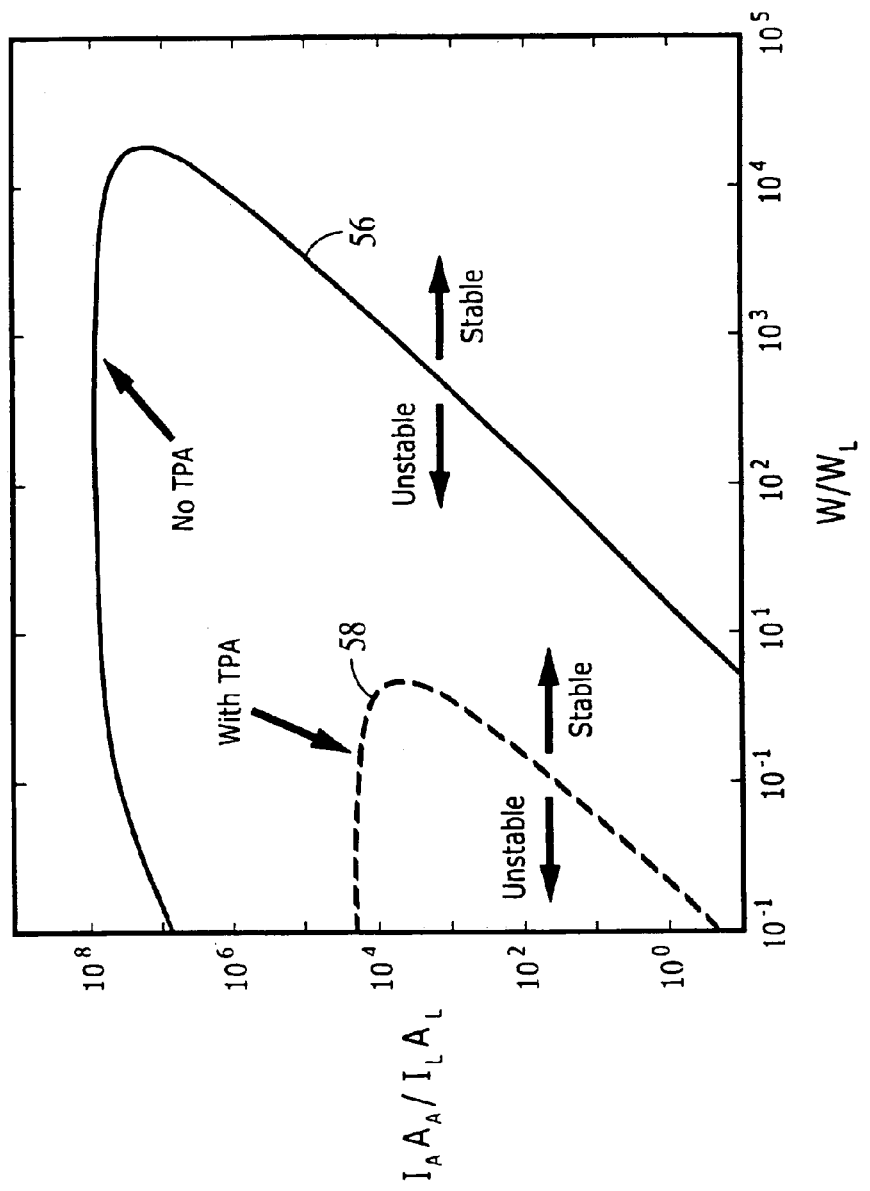
FIG. 7 shows stability contours for both the mirror of FIG. 4A and a similar mirror that lacks the TPA-based NIL element.

FIG. 7 illustrates the net impact of the TPA layer on the stability of a continuous-wave mode-locked laser pulse against QSML. FIG. 7 is a logarithmic plot of the saturation power of the absorber versus the pulse energy, calculated from equation (3). In FIG. 7, the saturation power and pulse energy are both normalized to gain saturation (($I_A A_A / I_L A_L$) versus (W/$W_L$)), where $A_A$ is the area of the spot focused on the absorber, $I_L$ is the saturation intensity of the gain, $A_L$ is the area of the beam in the gain medium, W is the pulse energy, and $W_L = I_L A_L T_R$ where $T_R$ is the round-trip time of the cavity. Assumed for the stability calculation was the full width at half maximum pulse width of a sech-shaped pulse (264 fs) and $q_0 T_L = 4.1 \times 10^4$, where $T_L$ is the upperstate gain lifetime normalized to the cavity round-trip time.

In FIG. 7, solid line 56 indicates the instability boundary when TPA is not included, and dashed line 58 indicates the instability boundary when TPA is included. Clearly, the addition of a TPA element to the system greatly increases the stability of the pulse train against QSML. Additional details regarding mirrors 22a and 22b, and the experimental data described above, are described in Thoen et al., "Two-Photon Absorption in Semiconductor Saturable Absorber Mirrors," *Applied Physics Letters*, 74(26): 3927–3929 (June 1999), which is incorporated herein by reference.

Numerous modifications of the structures of mirrors 22, 22a, and 22b are possible. For example, the number of InGaAs quantum wells can be varied within the $\lambda/2$ InP layer, such that the InP layer includes multiple sets of two, four, or any number of wells, rather than simply one set. The separation between each set of quantum wells can also be varied to achieve the desired levels of mode-locking and TPA.

In addition to varying the number of quantum wells within the InP layer, the InP layer itself can be cascaded. Thus, rather than one InP layer housing a set of quantum wells, the mirror can include multiple $\lambda/2$ InP layers, each including one or more sets of InGaAs wells. Increasing the number of InP layers increases the interaction length of the light with the TPA material, thereby enhancing TPA. In general, the amount of the TPA material, as well as the spot size produced by lens 20, can be optimized to produce the desired level of TPA.

Rather than using quantum wells to achieve saturable absorption, the saturable absorber can be a bulk layer or a heterostructure. In addition, materials other than InGaAs can be used as saturable absorbers.

Coatings other than resonant coating 36a and anti-reflective coating 36b can be used For example, a resonant coating can be structured specifically to enhance or optimize TPA and saturable absorption, e.g., by maximizing the electric field in the InP layer 34a or 34b. Instead of using alternating GaAs and AlAs layers to form the backmirror, the backmirror can be formed from other pairs of semiconductor materials or from a non-semiconductor Bragg stack. Alternatively, the backmirror can be a simple metal mirror or an oxide.

Techniques other than epitaxial deposition can be used to form the semiconductor layers of the mirror.

The TPA layers 34a and 34b need not be InP. As discussed above, the semiconductor material for the TPA layer should be chosen such that the band-gap is greater than the energy of a single photon, but less than the energy of two photons, so that TPA will be the dominant absorption process. For laser systems producing radiation at wavelengths of about 1400–1600 nm, InP is a suitable TPA material. Other materials which would exhibit TPA at this wavelength include GaAs and some compositions of (In, Ga)(As, P) and (In, Ga, Al)(Sb, As). At shorter wavelengths, e.g., 1100–1400 nm, material such as GaAs, InP, and Si would exhibit TPA. Other semiconductor materials which could be used, depending on the wavelength of the laser, include Group III–V materials, such as arsenides, nitrides, phosphides, and antimonides, Group II–VI materials, such as (Zn, Mg, S)(Se, Te), and Group IV materials, such as Si, SiGe, and Ge.

FCA Mirrors for Stabilizing Laser Output

Figure 8:
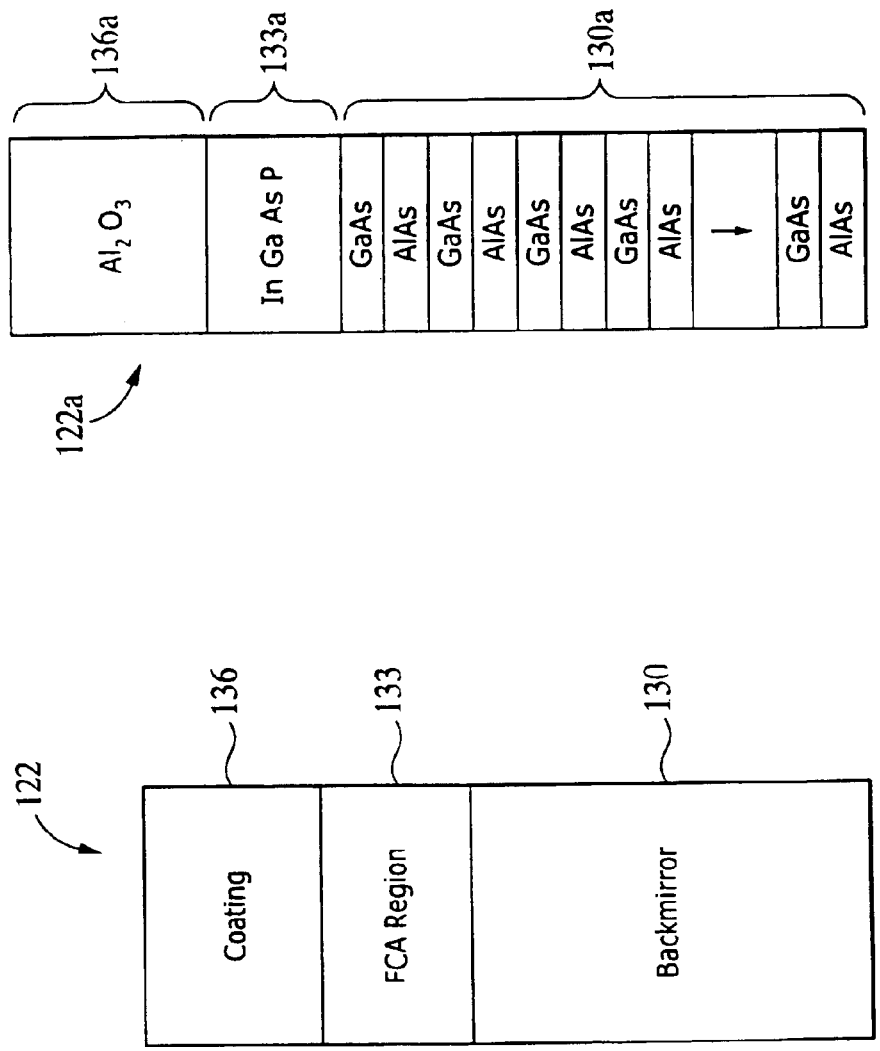
FIG. 8A is a cross-sectional schematic of an FCA-based NIL mirror.
FIG. 8B is a cross-sectional schematic of an embodiment of the mirror of FIG. 8A.

FIGS. 8A and 8B illustrate mirrors that produces nonlinear increasing loss via free carrier absorption, rather than TPA. Referring to FIG. 8A, an FCA mirror 122 generally includes a backmirror 130, a coating 136, and an FCA layer 133. The FCA layer 133 is made from a semiconductor material which, at the operative wavelength of the laser, acts as both a saturable absorber and an NIL element.

In general, the material forming layer 133 will act as both an absorber and an FCA-based NIL element if the laser's operative wavelength is well within the material's absorption band, as opposed to near the tail of the band. At such wavelengths, the material forming layer 133 first selectively absorbs low intensity radiation over high intensity pulses, mode-locking the laser. At high pulse energies, however, high densities of carriers are produced in the material's conduction band, and FCA becomes significant, producing NIL.

FIG. 8B illustrates one embodiment of an FCA mirror. Referring to FIG. 8B, a mirror 122a includes a backmirror 130a, an anti-reflective coating 136a, and a layer 133a of InGaAs(P) between backmirror 130 and anti-reflective coating 136. Depending on the design and the application, layer 133a can range in thickness from a few nanometers to hundreds of micrometers. Backmirror 130a and coating 136a are essentially identical to backmirror 30b and coating 36b of mirror 22b. Since the absorption band of InGaAs(P) can be adjusted between 550 and 4100 nm, mirror 122a exhibits both saturable absorption and FCA when used with laser systems having an operative wavelength well within that band.

Other embodiments of FCA mirror 122 are possible. For example, materials other than InGaAs(P) can be used to form layer 133. For radiation of about λ=1450–1650 nm, InGaAlAs or InGaAsSb could produce both saturable absorption and FCA. At shorter wavelengths, e.g., 980, 850, or 600 nm, materials such as InGaAsSb, InGaP, or InGaAs (P) could be used. Other semiconductor materials, such as those listed above as possible TPA materials, could also be used, depending on the center wavelength of the laser system.

Other Embodiments of TPA- and FCA-Based NIL Elements for Stabilizing Passively Mode-Locked Laser Output Numerous other embodiments of laser system 10 and the semiconductor based NIL elements are possible, and are within the scope of the claims.

The saturable absorber and the NIL element need not be located on a single monolithic mirror. The laser system could include a first mirror that mode-locks by saturable absorption, and a second mirror that has TPA or FCA layers. In addition, the TPA or FCA layers could be disposed on structures other than reflective mirrors, such as transmitting host semiconductor substrates, glass substrates, or other crystalline structures.

A structure with a TPA or FCA element could be used with laser systems mode-locked by mechanisms other than saturable absorption. For example, layers that produce TPA or FCA could be added to a mirror used in a system passively mode-locked by Kerr-lens mode-locking, additive-pulse mode-locking, polarization rotation, or polarization additive-pulse mode-locking.

The NIL element could be located on a structure in a nonlinear external cavity coupled to the laser cavity of system 10. For a description of nonlinear external cavities, see Keller et al., U.S. Pat. No. 5,007,059, which is incorporated herein by reference.

For some applications, it may be desirable to reduce the amount of NIL produced by a mirror that has a TPA or FCA producing layer. To reduce TPA or FCA, an anti-resonant coating could be added to the structure, producing an anti-resonant Fabry Perot etalon.

TPA or FCA could be used to enhance the stability of lasers using saturable absorber devices that are in a p-i-n geometry. A p-i-n saturable absorber geometry provides a means to actively modulate the loss of the mirror structure, thereby locking the laser repetition rate to an external electronic signal. For a discussion of p-i-n modulators, see Keller, U.S. Pat. No. 5,345,454, which is incorporated herein by reference.

In addition, a semiconductor mirror consisting only of TPA material in a p-i-n geometry could be used to reduce unwanted FCA. As TPA occurs, carriers are generated in the TPA high energy state. If TPA excites enough carriers to the high energy state, the carriers begin to produce FCA to an even higher energy level. This unwanted FCA can disrupt the optimized levels of saturable absorption and NIL. If the TPA material is used in a p-i-n geometry, however, a voltage across the TPA region would constantly sweep out carriers, reducing the carrier lifetime and thereby reducing unwanted FCA effects.

TPA or FCA layers could be added to a reflector that also acts as an output coupler. See Sharp et al., U.S. Pat. No. 5,666,373 (describing incorporation of a saturable absorber into a reflector that acts as an output coupler).

Proper design of a structure to include TPA or FCA materials could be combined with the strain relief technique described in Cunningham et al., U.S. Pat. No. 5,701,327. In addition, a strain relief layer consisting only of a TPA material could be integrated onto a semiconductor mirror of a different material system, to attain greater bandwidth.

TPA- and FCA-based NIL elements can be used with laser systems other than the Er/Yb system 10. For example, reflectors incorporating NIL elements can be used in solid state lasers, as well as in fiber, dye, semiconductor, or gas lasers. In each case, the NIL element will be configured to exhibit TPA or FCA at an operative wavelength of the laser.

In addition, the laser system can be tunable, since both TPA and FCA processes are fairly broadband. Thus, even though the TPA- or FCA-based NIL element will be configured for a particular, operative wavelength of a laser system, in some embodiments, the element may produce NIL over a range of wavelengths that includes the operative wavelength. The range over which the NIL element will continue to produce significant TPA or FCA will depend on a number of factors, including the pulse width, the type of saturable absorber and NIL element and the level of precision required for the particular application.

NIL elements can be used to stabilize mode-locking against disturbances other than QSML. For example, the NIL elements can be used to stabilize a CWML state against Q-switching.

NIL Elements for Actively Mode-Locked Systems

Semiconductor NIL elements can also be used to suppress supermodes in an actively mode-locked laser system. As discussed above, a laser system is actively mode-locked by imposing a pulse pattern on the laser with an external function generator, such as an electro-optic modulator. Operation when all pulse slots are not filled, partially filled, or the filling changes in time, excites supermodes. In the radio frequency spectrum, supermodes appear as harmonics of the cavity round-trip time at frequencies other than the repetition rate or integer multiples of the repetition rate. Excited supermodes are generally undesirable, since most applications of an actively mode-locked laser require a stable pulse train (i.e., no pulse dropouts or no fluctuations in pulse number).

Figure 9:
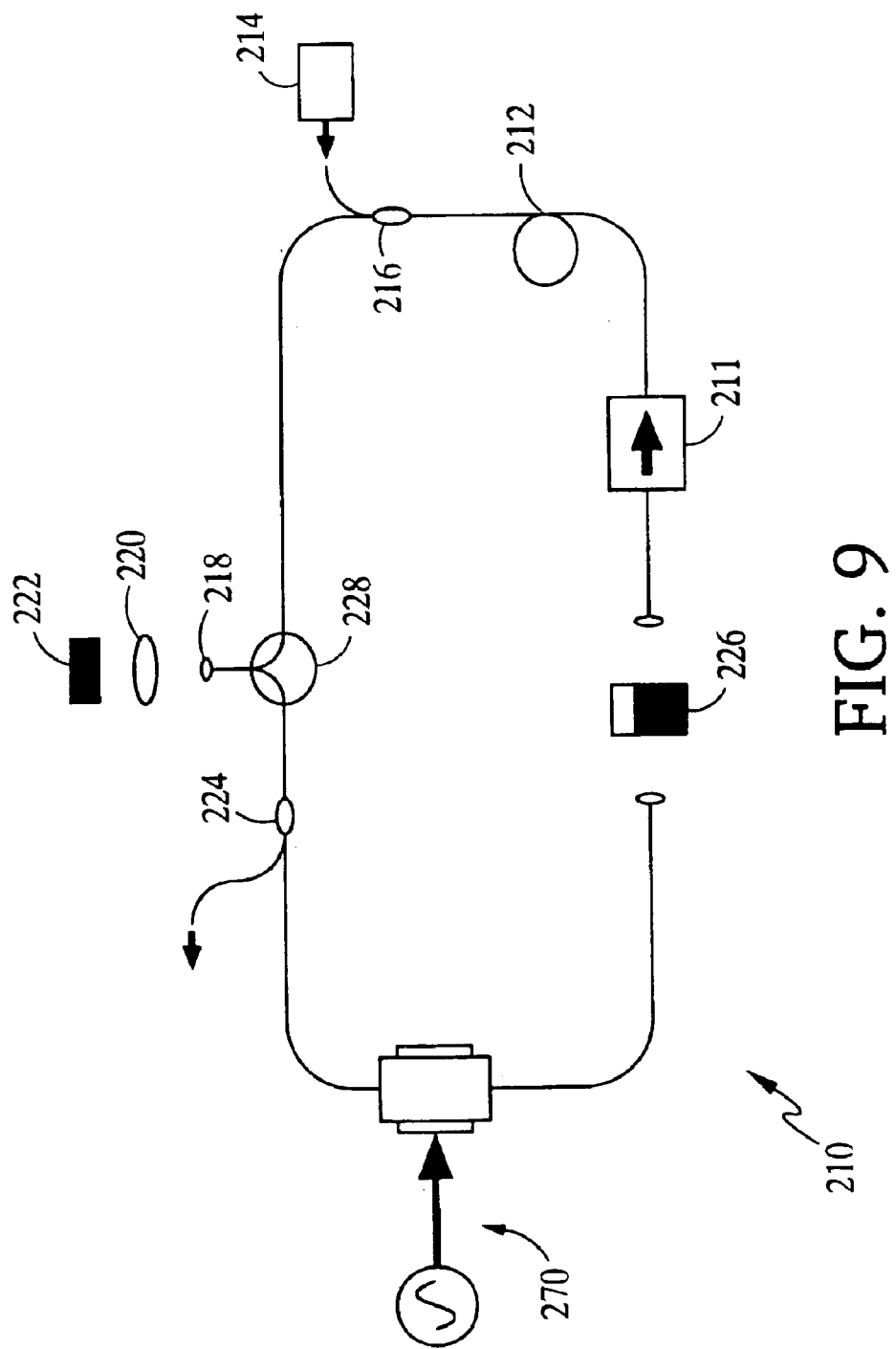
FIG. 9 is a schematic of an actively mode-locked laser system that includes a mirror having a semiconductor NIL element.

FIG. 9 illustrates a laser system 210 that includes a TPA-based NIL element on a mirror 222. The TPA element suppresses supermodes by introducing a higher loss for higher peak intensities, thereby suppressing amplitude fluctuations, reducing pulse dropouts, and favoring a filled pulse train of lower intensity pulses over a partially filled train of higher intensity pulses.

Referring to FIG. 9, laser system 210 includes an isolator 211, erbium doped fiber 212, a pump 214, a wavelength division multiplexer 216, a collimator 218, a 10% output coupler 224, and a 20 nm bandpass filter 226. Pump 214 pumps the erbium doped fiber at 980 nm, generating laser light having a wavelength of about 1530–1565 mn, depending on the filter setting. Isolator 211 forces system 210 to operate unidirectionally, collimator 218 collimates the laser beam out of the cavity and into free space, and the wavelength division multiplexer couples the pump light into the laser cavity. An external 2 GHz synthesizer 270 actively mode-locks laser system 210, producing a pulse train having a frequency of approximately 2 GHz (i.e., approximately one pulse per 500 ps).

A circulator 228 incorporates mirror 222 into the laser cavity. Circulator 228 directs light to mirror 222 via a lens 220. Lens 220 focuses the light to a spot size of, e.g., $5 \times 10^{-8}$ cm$^2$ on mirror 222.

Referring to FIG. 10, mirror 222 generally includes a reflective backmirror 230, a TPA region 234, and a coating 236. In one embodiment, illustrated in FIG. 10B, a backmirror 230a is made from twenty-two pairs of alternating layers of GaAs and AlAs, and an anti-reflective coating 236a is made from a single ¼λ thick layer of $Al_2O_3$. A TPA layer 234a is a 5100 nm thick InP layer deposited using gas source molecular beam epitaxy. As discussed above, at about 1550 nm, InP exhibits TPA. Thus, TPA layer 234a produces NIL by introducing a higher loss for higher peak intensities. Mirror 222a, therefore, favors a fully filled pulse train of lower intensity pulses over a partially filled train of higher intensity pulses, and thereby suppresses supermodes.

Figure 11A:
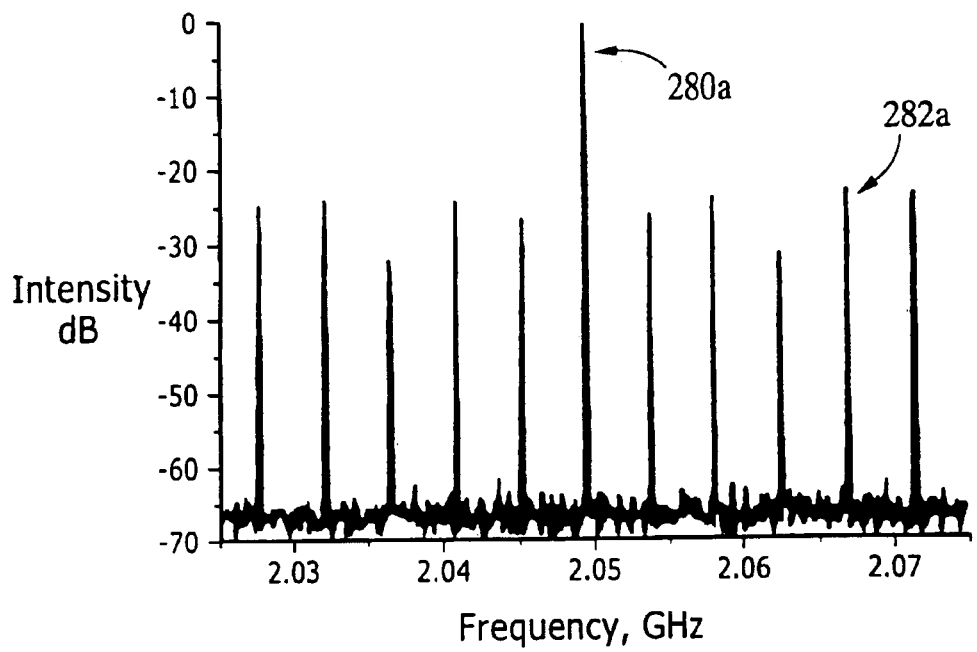
FIG. 11A is a graph showing output of the laser system of FIG. 9 when the mirror of FIG. 10 was replaced with a mirror that did not include the semiconductor NIL element.

Two experiments were performed to determine the extent to which TPA layer 234a suppresses supermodes. First, system 210 was operated with an evaporatively coated dielectric mirror in place of mirror 222. The evaporatively coated mirror lacked a TPA region 234. FIG. 11A illustrates the resulting radio frequency spectrum. In FIG. 11A, the repetition rate near 2 GHz (about 2.05 GHz) is visible as peak 280a. The output also shows ten harmonics indicative of unwanted supermodes (e.g., peak 282a). The supermode harmonics are suppressed by about 25 dB relative to peak 280a.

Figure 11B:
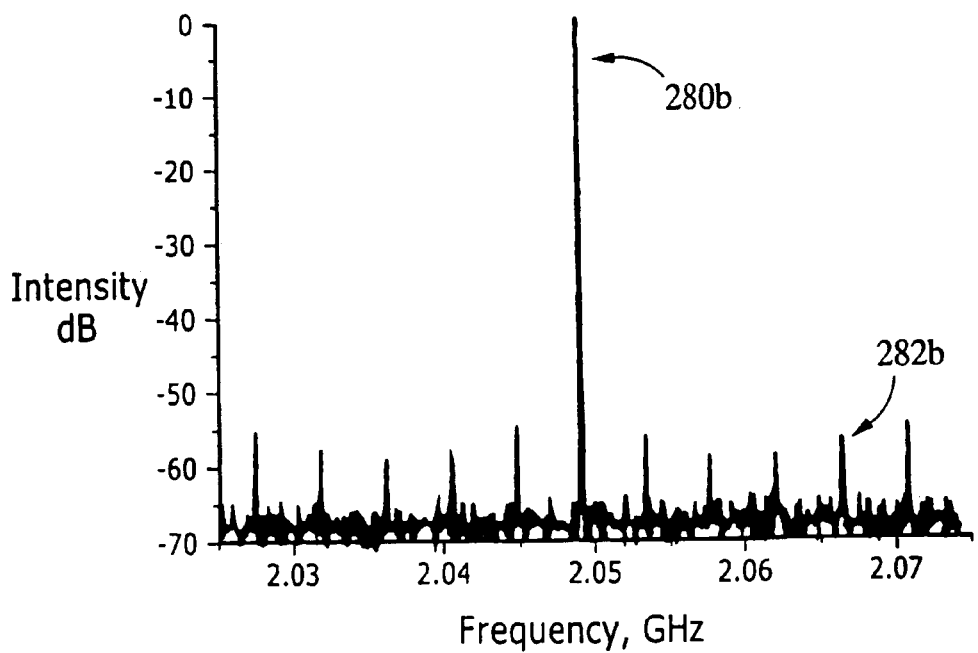
FIG. 11B is a graph showing output of the laser system of FIG. 9 including the mirror of FIG. 10.

Laser system 210 was then operated again with mirror 222a in place, rather than the non-TPA evaporatively coated dielectric mirror. FIG. 11B shows the resulting radio frequency spectrum. As in FIG. 11A, the fundamental repetition rate at 2.05 GHz pulse is a clearly visible peak 280b. In this output, however, the ten supermode harmonics (e.g., peak 282b) are suppressed by about 55 dB relative to the primary peak, rather than by about 25 dB. Thus, the addition of TPA layer 234 enhances supermode suppression by about 30 dB. The intensity dependence of the TPA effect was verified by repeating the experiment without the focusing lens 220; without lens 220, the spot size was about $9.5 \times 10^{-3}$ cm$^2$, and the output was similar to the output shown in FIG. 11A.

Other embodiments of semiconductor NIL elements for actively mode-locked lasers are possible. For example, the material forming TPA region 234 can be varied, depending on the wavelength of the laser, as described above. The TPA mirror 222 can be integrated into the laser cavity using a device other than a circulator. For example, a first collimator can collimate the beam from the fiber ring to mirror 222, and a second collimator can collimate the reflection from mirror 222 back into the ring.

Figure 12:
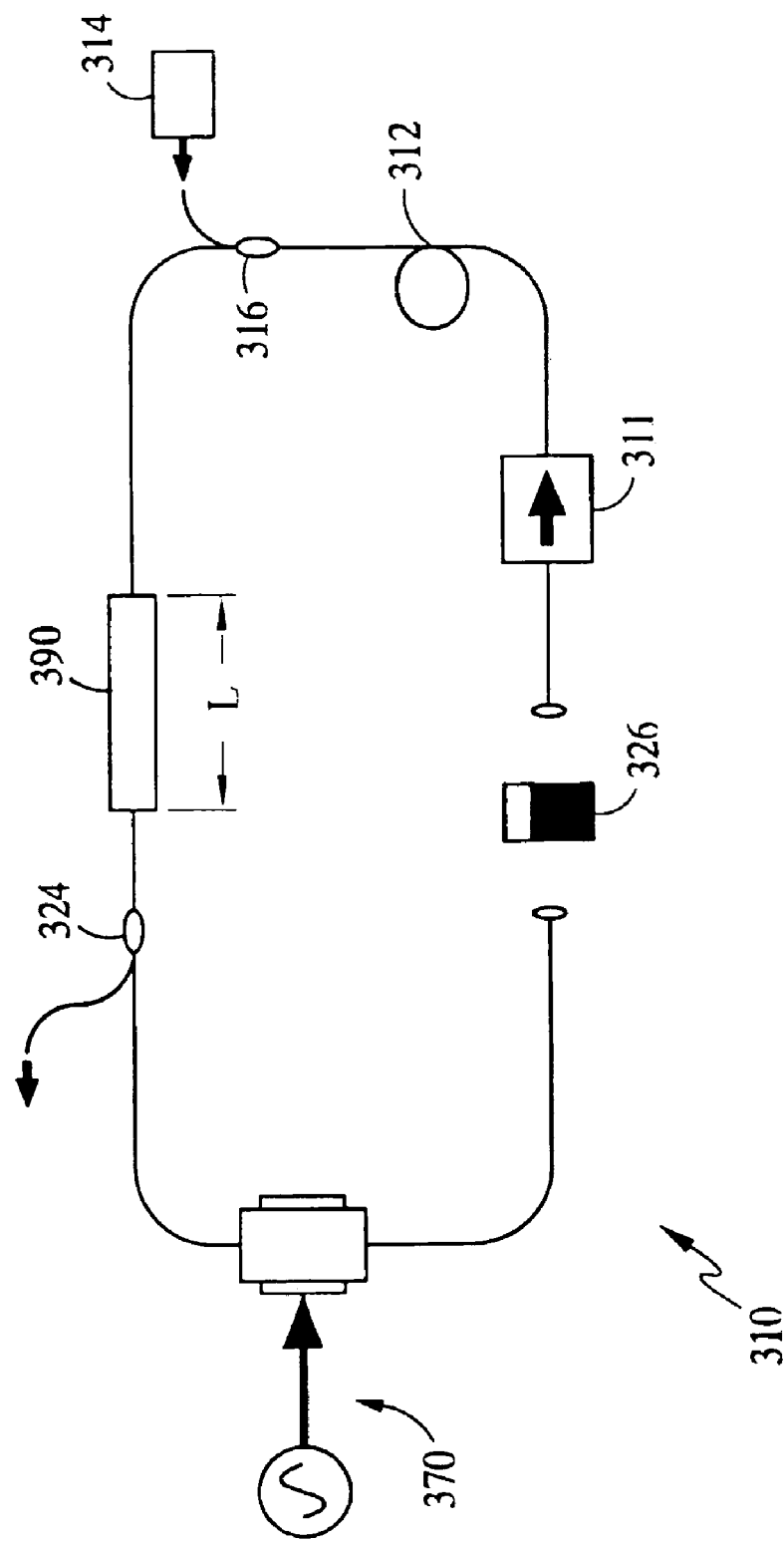
FIG. 12 is a schematic of an actively mode-locked laser system that includes a TPA waveguide for producing an adjustable NIL.

The semiconductor NIL element can be located on structures other than a mirror. For example, as illustrated in FIG. 12, the TPA material can form a waveguide, rather than a layer on a mirror. Referring to FIG. 12, a laser system 310 includes an isolator 311, erbium doped fiber 312, a pump 314, a wavelength division multiplexer 316, a 10% output coupler 324, and a 20 nm bandpass filter 326, similar in material respects to the corresponding components of system 210. In place of circulator 228, collimator 218, lens 220, and mirror 222, however, system 310 includes a waveguide 390.

Waveguide 390 couples light into an index structure that confines the light to, e.g., a single mode. At least one of the materials forming the waveguide exhibits TPA at the operative wavelength, thereby producing NIL. For example, waveguide 390 could be formed from InGaAs and InP. These materials have differing indexes of refraction, thereby propagating the light through the waveguide, and the InP material produces TPA.

Using waveguide 390 to produce TPA allows the amount of TPA, and therefore the amount of NIL, to be controlled by simply varying the length L of the waveguide. As the length L is increased, the interaction length of the light with the TPA material increases, thereby increasing the NIL. Conversely, decreasing L decreases the amount of TPA. Thus, a user can optimize system 310 to produce the desired amount of TPA by simply selecting a waveguide having the appropriate length.

To some extent, the amount of TPA produced by mirror 222 can also be increased by further focusing the spot size produced by lens 220, or by increasing the thickness of TPA region 234. However, if the thickness of region 234 is greater than the confocal parameter (the confocal parameter is essentially the length of a tight focus), then further focusing the spot size will not substantially increase TPA, since any increase in TPA produced by increased intensity through tighter focusing will be canceled by a corresponding decrease in interaction length. Thus, for some applications, using a TPA waveguide, rather than a TPA mirror, may offer more optimization flexibility.

In addition to disposing the semiconductor NUL element on a reflective structure, such as mirror 234, or a transmissive structure, such as waveguide 390, the element could be located on glass or crystalline substrates, or other types of structures.

Rather than a fiber ring system, the laser system can be, e.g., an actively mode-locked waveguide laser similar to system 110, or the various other types of laser systems listed above.

Using a semiconductor NIL element to suppress supermodes has several advantages over existing methods, such as additive pulse limiting and self-phase modulation plus filtering. To suppress supermodes with additive pulse limiting, for example, polarization rotation must occur, resulting in a polarization-dependent loss. Similarly, with self-phase modulation plus filtering, the dispersion and non-linear length must be controlled, often requiring additional fiber in the cavity, and imposing significant design constraints on the laser system. By contrast, using semiconductor NIL element on a mirror, such as mirror 222, allows supermode suppression with minimal insertion loss, and without requiring additional fiber in the cavity, making the laser more environmentally stable. In addition, the NIL element stabilizes the pulse train regardless of the dispersion, and across a broad wavelength range.

What is claimed is:

1. A laser system that produces radiation at an operative wavelength, the system defining a laser cavity having an associated electric field pattern at the operative wavelength, and the system comprising:
   a mode-locking element configured to mode-lock output of the laser system; and
   a nonlinear increasing loss element that includes a semiconductor material
      having a band-gap larger than the energy of a photon at the operative wavelength and smaller than twice the energy of a photon at the operative wavelength, and
      having a position with respect to the electric field pattern and a thickness such that the semiconductor material provides increasing absorption of radiation at the operative wavelength as energy density of radiation within the semiconductor material increases, to enhance stability of the mode-locked output.

2. The laser system of claim 1, wherein the semiconductor material exhibits sufficient two-photon absorption at the operative wavelength to achieve the increasing absorption.

3. The laser system of claim 2, further comprising a reflective structure disposed along an optical path in the cavity, wherein the nonlinear increasing loss element comprises one or more layers of the semiconductor material disposed on the reflective structure.

4. The laser system of claim 1, wherein the a semiconductor material has a conduction band, and the semiconductor material, when exposed to radiation having the operative wavelength, generates sufficient carriers in the conduction band to initiate sufficient free carrier absorption at the operative wavelength to achieve the increasing absorption.

5. The laser system of claim 4, further comprising a reflective structure disposed along an optical path in the cavity, wherein the nonlinear increasing loss element comprises one or more layers of the semiconductor material disposed on the reflective structure.

6. The laser system of claim 1, further comprising a transmissive structure disposed along an optical path in the cavity, the transmissive structure including the nonlinear increasing loss element.

7. The laser system of claim 1, wherein the system is tunable to produce radiation over a wavelength range, the wavelength range including the operative wavelength.

8. The laser system of claim 1, wherein the mode-locking element comprises a saturable absorber that passively mode-locks the laser system.

9. The laser system of claim 1, wherein the mode-locking element comprises an external function generator driving a modulator that actively mode-locks the laser system.

10. A laser system that defines a laser cavity having an associated electric field pattern at an operative wavelength, the system comprising:
    a pump;
    a gain medium that produces radiation at the operative wavelength when pumped by the pump;
    a reflector disposed along an optical path in the cavity, the reflector comprising one or more layers of a first semiconductor material that acts as a saturable absorber at the operative wavelength to mode-lock output of the laser system, and one or more layers of a second semiconductor material having a band-gap larger than the energy of a photon at the operative wavelength and smaller than twice the energy of a photon at the operative wavelength, and having a position with respect to the electric field pattern and a thickness such that the second semiconductor material provides increasing absorption of radiation at the operative wavelength as energy density of radiation within the second semiconductor material increases, to enhance stability of the mode-locked output.

11. The laser system of claim 10, wherein the second semiconductor material exhibits sufficient two-photon absorption at the operative wavelength to achieve the increasing absorption.

12. The laser system of claim 11, wherein the second semiconductor material comprises InP.

13. The laser system of claim 12, wherein the first semiconductor material comprises InGaAs.

14. The laser system of claim 12, wherein the gain medium comprises an Er/Yb waveguide.

15. The laser system of claim 10, wherein the reflector is configured such that, when light having the operative wavelength is incident upon the reflector, a resulting electric field within the reflector forms a standing wave within the reflector.

16. The laser system of claim 15, wherein the standing wave has a local maximum at a location of one or more layers of the first semiconductor material.

17. The laser system of claim 15, wherein the standing wave has a local maximum at a location of one or more layers of the second semiconductor material.

18. The laser system of claim 10, wherein the reflector further comprises a dielectric backmirror configured to reflect light having the operative wavelength.

19. The laser system of claim 10, wherein the reflector further comprises a resonant coating or an anti-reflective coating.

20. A laser system that defines a laser cavity having an associated electric field pattern at an operative wavelength, the system comprising:
    a pump;
    a gain medium that produces radiation at the operative wavelength when pumped by the pump;
    an element that actively mode-locks output of the laser system;
    a structure disposed along an optical path in the cavity, the structure comprising a semiconductor material having a band-gap larder than the energy of a photon at the operative wavelength and smaller than twice the energy of a photon at the operative wavelength, and having a position with respect to the electric field pattern and a thickness such that the semiconductor material provides increasing absorption of radiation at the operative wavelength as energy density of radiation within the semiconductor material increases, to enhance stability of the mode-locked output.

21. The laser system of claim 20, wherein the semiconductor material exhibits sufficient two-photon absorption at the operative wavelength to achieve the increasing absorption.

22. The laser system of claim 21, wherein the gain medium comprises erbium doped fiber, and the semiconductor material comprises InP.

23. The laser system of claim 20, wherein the structure comprises a reflector, the reflector comprising one or more layers of the semiconductor material.

24. The laser system of claim 20, wherein the structure comprises a transmissive substrate that includes the semiconductor material.

25. The laser system of claim 24, wherein the structure comprises a waveguide.

26. A method of enhancing the stability of a continuous wave mode-locked output of a laser, the laser producing radiation at an operative wavelength and the laser defining a cavity having an associated electric field pattern at the operative wavelength, the method comprising:
  passively mode-locking the output of the laser to produce a continuous train of pulses; and
  stabilizing the continuous train of pulses against intensity fluctuations by incorporating into the cavity a nonlinear increasing loss element that includes a semiconductor material having a band-gap larger than the energy of a photon at the operative wavelength and smaller than twice the energy of a photon at the operative wavelength and having a position with respect to the electric field pattern and a thickness such that the semiconductor material provides increasing absorption of radiation at the operative wavelength as energy density of radiation within the semiconductor material increases, to enhance stability of the mode-locked output.

27. The method of claim 26, wherein the stabilizing step includes stabilizing the continuous train of pulses against Q-switched mode-locking.

28. The method of claim 26, wherein the mode-locking step includes mode-locking by incorporating a saturable absorber into the cavity.

29. The method of claim 26, wherein the semiconductor material exhibits sufficient two-photon absorption at the operative wavelength to achieve the increasing absorption.

30. The method of claim 26, wherein the stabilizing step includes incorporating a mirror into the cavity, the mirror having one or more layers that comprise the semiconductor material.

31. The method of claim 26, wherein the semiconductor material has a conduction band, and the semiconductor material, when exposed to radiation having the operative wavelength, generates sufficient carriers in the conduction band to initiate sufficient free carrier absorption at the operative wavelength to achieve the increasing absorption.

32. A method of suppressing supermodes in the output of an actively mode-locked laser, the laser producing radiation at an operative wavelength and the laser defining a cavity having an associated electric field pattern at the operative wavelength, the method comprising:
  actively mode-locking the laser to produce a continuous train of pulses; and
  incorporating a nonlinear increasing loss element into the cavity, the nonlinear increasing loss element including a semiconductor material having a band-gap larger than the energy of a photon at the operative wavelength and smaller than twice the energy of a photon at the operative wavelength, and having a position with respect to the electric field pattern and a thickness such that the semiconductor material provides increasing absorption of radiation at the operative wavelength as energy density of radiation within the semiconductor material increases, to limit peak intensity of the pulses, and thereby suppress supermodes.

33. The method of claim 32, wherein the semiconductor material exhibits sufficient two-photon absorption at the operative wavelength to achieve the increasing absorption.

34. The method of claim 32, wherein the incorporating step includes incorporating a mirror into the cavity, the mirror including one or more layers of the semiconductor material.

35. The method of claim 32, wherein the incorporating step includes incorporating a waveguide into the cavity, the waveguide being partly formed from the semiconductor material.

* * * * *